(12) United States Patent
Stolboushkin et al.

(10) Patent No.: US 11,782,098 B2
(45) Date of Patent: Oct. 10, 2023

(54) FRAC DART, METHOD, AND SYSTEM

(71) Applicants: Eugene Stolboushkin, Houston, TX (US); YingQing Xu, Tomball, TX (US); Daniel M. Cousin, Humble, TX (US)

(72) Inventors: Eugene Stolboushkin, Houston, TX (US); YingQing Xu, Tomball, TX (US); Daniel M. Cousin, Humble, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/236,290

(22) Filed: Apr. 21, 2021

(65) Prior Publication Data
US 2022/0342006 A1    Oct. 27, 2022

(51) Int. Cl.
| | | |
|---|---|---|
| *E21B 34/14* | (2006.01) | |
| *G01R 33/00* | (2006.01) | |
| *H02K 1/34* | (2006.01) | |
| *E21B 43/26* | (2006.01) | |

(52) U.S. Cl.
CPC ........ *G01R 33/0023* (2013.01); *E21B 34/142* (2020.05); *E21B 43/26* (2013.01); *H02K 1/34* (2013.01)

(58) Field of Classification Search
CPC ... E21B 34/14; E21B 34/142; G01R 33/0023; H02K 1/34
See application file for complete search history.

(56) References Cited

U.S. PATENT DOCUMENTS

| | | | |
|---|---|---|---|
| 2,558,427 A | 6/1951 | Fagan | |
| 2,892,151 A | 6/1959 | Carlos | |
| 6,170,573 B1 | 1/2001 | Brunet et al. | |
| 7,819,198 B2 | 10/2010 | Birckhead et al. | |
| 8,297,367 B2 | 10/2012 | Chen et al. | |
| 8,505,632 B2 * | 8/2013 | Guerrero ................. | E21B 34/06 166/373 |
| 9,284,817 B2 | 3/2016 | Walton et al. | |
| 9,441,470 B2 | 9/2016 | Guerrero et al. | |
| 9,683,419 B2 * | 6/2017 | Coon ....................... | E21B 43/14 |
| 9,714,559 B2 | 7/2017 | Ring et al. | |
| 9,909,384 B2 * | 3/2018 | Chauffe ................. | E21B 33/129 |

(Continued)

FOREIGN PATENT DOCUMENTS

WO    2017062118 A1    4/2017

OTHER PUBLICATIONS

Notification of Transmittal of the International Search Report and the Written Opinion of the International Searching Authority, or the Declaration; PCT/US2022/025009: dated Apr. 15, 2022; 11 pages.

(Continued)

*Primary Examiner* — Matthew R Buck
(74) *Attorney, Agent, or Firm* — CANTOR COLBURN LLP

(57) ABSTRACT

A frac dart including a pressure housing, a mechanically actuated magnetic sensor including a first magnet outside of the pressure housing, a signal generator inside the pressure housing and in operable communication with the first magnet, and an electrical counter disposed in the frac dart responsive in increments to the signal generator.

23 Claims, 13 Drawing Sheets

(56) References Cited

U.S. PATENT DOCUMENTS

| | | |
|---|---|---|
| 10,100,612 B2 | 10/2018 | Liwoswki et al. |
| 10,125,573 B2 | 11/2018 | Flores Perez et al. |
| 10,392,910 B2 | 8/2019 | Walton et al. |
| 10,927,635 B2 | 2/2021 | Kelbie et al. |
| 11,365,602 B2 | 6/2022 | Vracar et al. |
| 2010/0294515 A1 | 11/2010 | Xu |
| 2011/0240301 A1 | 10/2011 | Robison et al. |
| 2012/0085538 A1 | 4/2012 | Guerrero et al. |
| 2013/0220603 A1 | 8/2013 | Robison et al. |
| 2013/0333872 A1 | 12/2013 | McMillon et al. |
| 2014/0060803 A1 | 3/2014 | Gano |
| 2014/0076542 A1* | 3/2014 | Whitsitt .................. E21B 34/14 166/250.1 |
| 2016/0084075 A1 | 3/2016 | Ingrham et al. |
| 2017/0009551 A1 | 1/2017 | Barbato |
| 2021/0238982 A1 | 8/2021 | Schulte et al. |
| 2021/0238988 A1* | 8/2021 | Watkins ................ E21B 34/142 |
| 2022/0145715 A1 | 5/2022 | Pye |
| 2022/0341289 A1 | 10/2022 | Stolboushkin et al. |
| 2022/0344091 A1 | 10/2022 | Stolboushkin et al. |

OTHER PUBLICATIONS

International Search Report and Written Opinion; PCT/US2022/025000; Korean Intellectual Property Office; dated Jul. 28, 2022; 10 pages.
Notification of Transmittal of the International Search Report and the Written Opinion of the International Searching Authority, or the Declaration; PCT/US2022/025014; dated Apr. 15, 2022: 11 pages.

* cited by examiner

FRAC DART, METHOD, AND SYSTEM

BACKGROUND

In the resource recovery and fluid sequestration industry, many fracture stages are often required. Traditionally, objects such as balls or darts are used in a step-up manner to actuate particular landing features. For example, traditional means include using a smallest diameter ball of a set of balls first to reach a downholemost landing feature and then stepping up in diameter, usually by 1/16 inch increments for each adjacent landing feature moving to a least downhole landing feature. The number of stages possible with this traditional method becomes limited at an upper limit by a diameter of the string in which the landing features reside and at a lower limit by practicality of how small a landing feature can be while still allowing sufficient flow while open to allow well operations. The art would like to avoid the limitations on number on fracture stages in a wellbore.

SUMMARY

An embodiment of a frac dart including a pressure housing, a mechanically actuated magnetic sensor including a first magnet outside of the pressure housing, a signal generator inside the pressure housing and in operable communication with the first magnet, and an electrical counter disposed in the frac dart responsive in increments to the signal generator.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
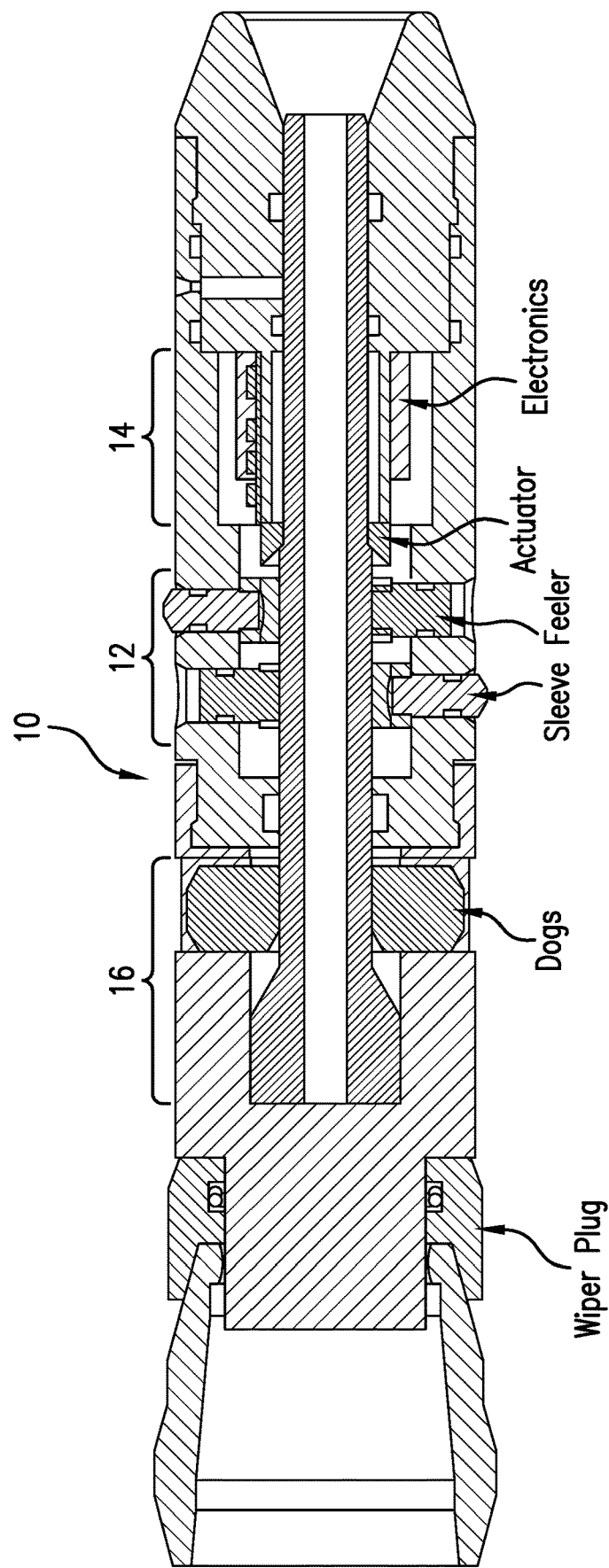
FIG. 1 is a cross sectional view of a frac dart as disclosed herein.
Figure 2:
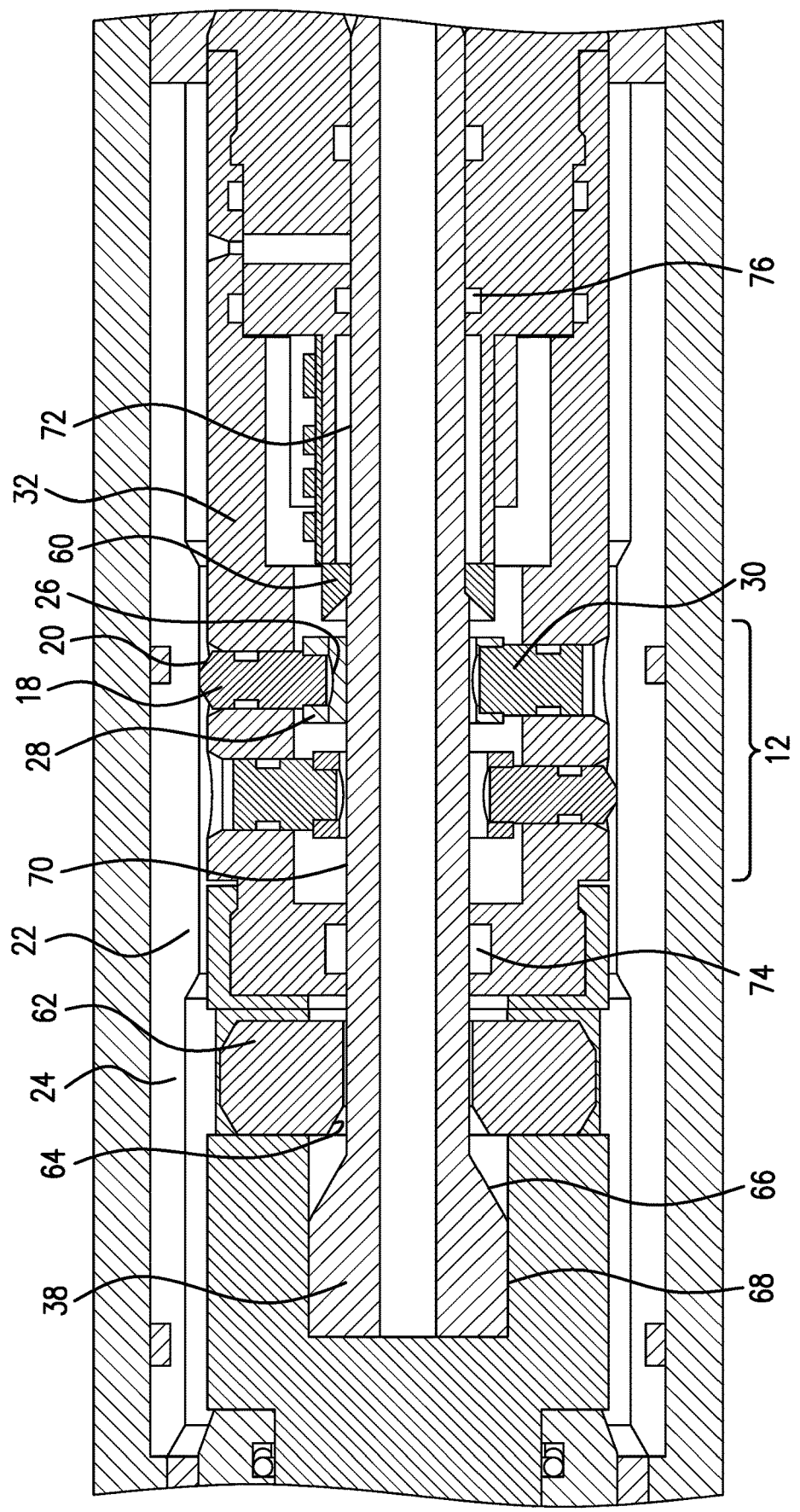
FIG. 2 is an enlarged cross section view of a part of FIG. 1 illustrating a mechanical sensor embodiment.
Figure 3:
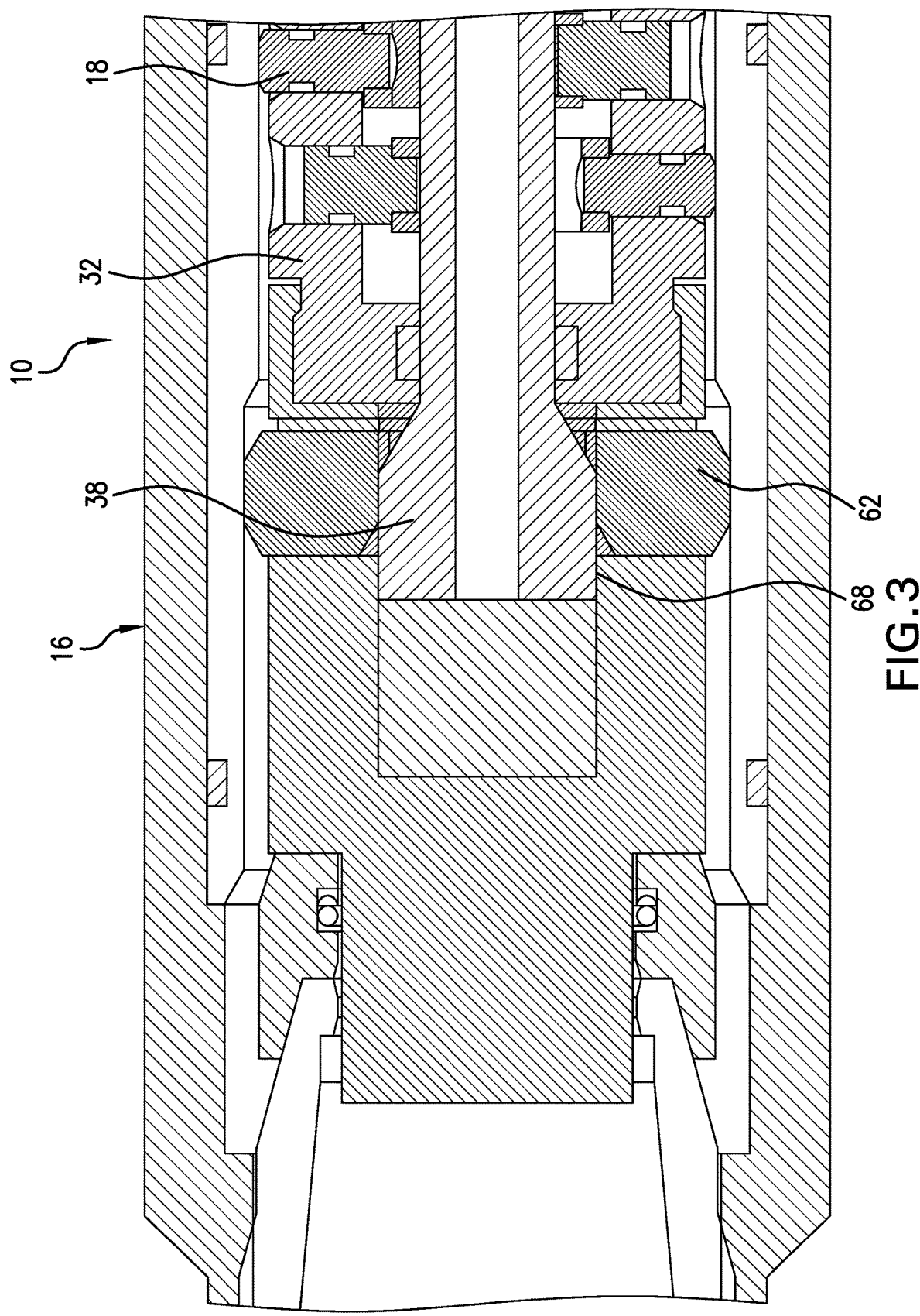
FIG. 3 is another enlarged cross section of a part of FIG. 1 illustrating an actuator of the frac dart.

Referring to FIGS. 1-3, a frac dart 10 is illustrated in cross section. The term "frac" as used herein means "fracture" and is colloquial to the industry to which the device pertains. The dart 10 includes a mechanical sensor 12 (embodiments as 12a and 12b), an electric counter 14 and a mechanical engagement configuration 16. The dart 10 registers sleeves while moving through a borehole by physical contact between the mechanical sensor 12 and a feature of the sleeve through which it is moving. Each time the mechanical sensor 12 is triggered, a count is registered by the electric counter 14. In this way, the dart 10 gathers information mechanically and counts it electrically. When a count of the electrical counter 14 reaches a predetermined number, a signal is sent to the mechanical engagement configuration 16 to deploy and engage with the feature of the sleeve it is intended to select. Power considerations with regard to this arrangement are reduced relative to what is required in prior art arrangements because, in embodiments, the electric counter comprises only integrated circuits without memory and other higher energy components of computers. The referenced embodiment is not a computer at all and uses almost no energy when operational and when not operational suffers only parasitic loss. Further, embodiments of the electric counter 14 require no "interface box" that lets a laptop communicate with an onboard computer and no software on a laptop to program the dart 10. In fact, no laptop is required at all. Rather a simple mechanical "programming" is all that is needed and is discussed below.

The lack of computational components also provides a benefit of long battery shelf life in the tool (frac dart 10). There is also very little energy required in order to deploy the mechanical engagement configuration 16, in some embodiments, because the prime mover of configuration 16 is not electric power but another source discussed further below. The electric power need only make an activator perform. Again, this makes for greater battery storage life in the tool and smaller batteries required overall.

Figure 4:
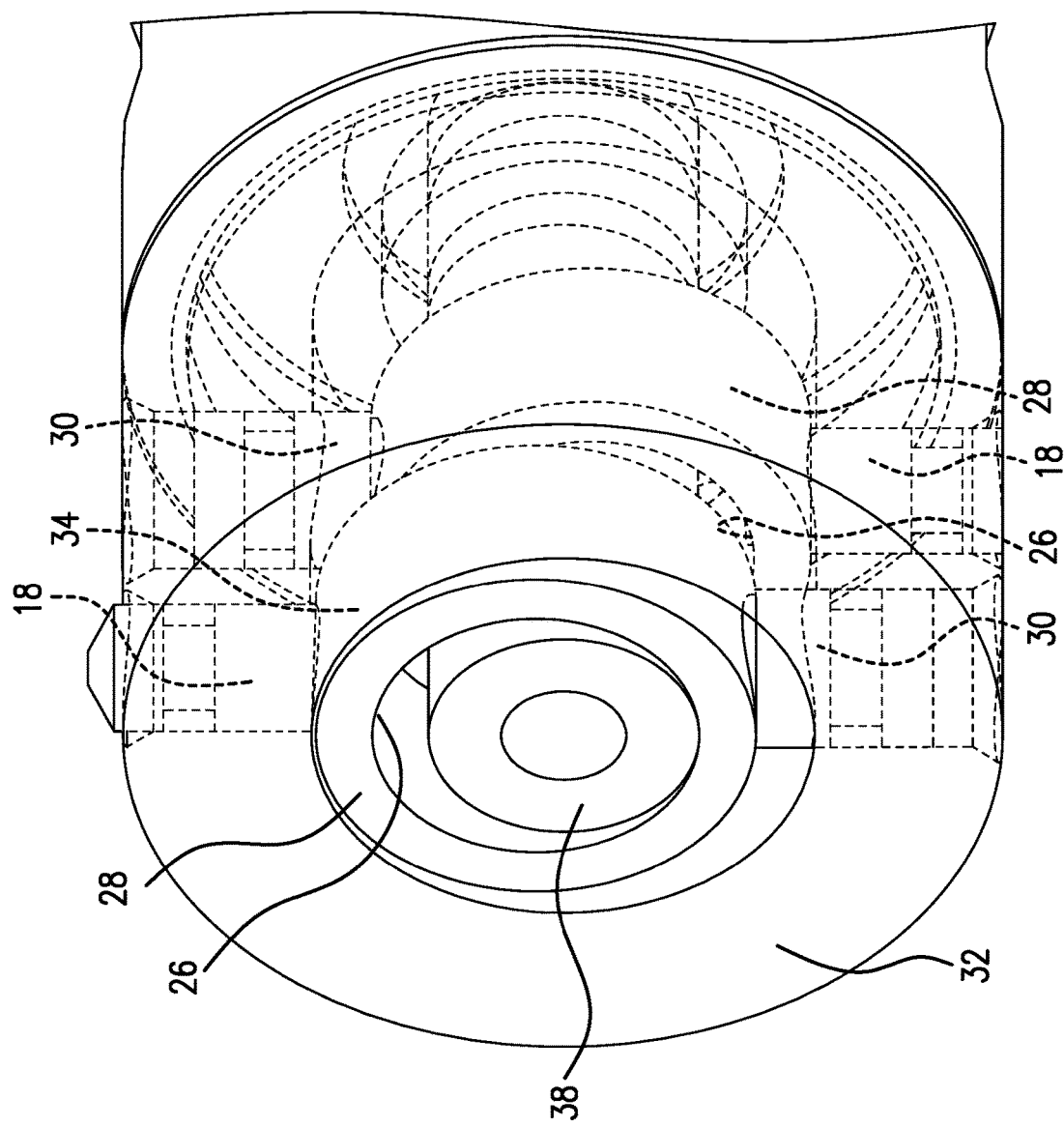
FIG. 4 is a perspective view of one embodiment of the mechanical sensor and as illustrated in FIG. 1.

Focusing upon the mechanical sensor 12a disposed in the dart 10, FIGS. 1, 2 and 4 are initially referenced. In FIG. 2, the sensor 12a includes a first member 18 that has a bump tip 20. The member is configured to move radially outwardly under the influence of hydrostatic pressure in this embodiment. If the member 18 is physically displaced radially inwardly by a feature 22 of a sleeve 24, the member 18 will make a contactor 26 (26a and 26b in embodiments) create an electrical connection. In connection with the hydraulic bias of this particular embodiment mentioned above, it is to be clear that the first member 18 is connected to an intermediate member 28, which in turn is connected to a second member 30. Hydraulic diameters of the first member 18 and the second member 30 are different. The second member 30 has a greater hydraulic diameter than first member 18. Consequently, when the mechanical sensor 12a is exposed to pressure external of a pressure housing 32 through which the sensor 12a is mounted, while the volume internal to the pressure housing is at atmospheric pressure, the sensor 12a will tend to move the first member 18 radially outwardly of the pressure housing 32. In FIG. 4, a perspective view of this embodiment of sensor 12a is illustrated. This view provides an understanding of the nature of the intermediate member 28 in some embodiments, but it is to be understood that the ring shape is not required. It could also be a half ring, portion of a ring, other geometric form, etc. The ring shape allows for components or flow to be routed longitudinally and axially of the tool but this is only of interest in some situations. In other situations, there is no need for anything to extend or flow through the mechanical sensor 12a and hence the intermediate member 28 could be a shaft providing a provision is made for at least one of the first member, the intermediate member or the second member to cause the contactor 26a to close at the appropriate time (i.e. when the sensor 12a is properly triggered). In the embodiment illustrated in FIG. 4, the intermediate member 28 is a ring and the contactor 26a is located at the ID (inside dimension) of that ring. One of skill in the art will comprehend that with the contactor 26a at the ID of the intermediate member 28, the contactor 26a is made to close when the first member moves radially inwardly of housing 32. The contactor 26a is closed by making contact with another component (such as an actuator 38 in this Figure). It is also possible however that the contactor 16 could be placed upon an OD (outside dimension) surface 34 of member 28, which would mean the contactor would close when the first member 18 moves radially outwardly of the housing 32. It is also possible to place the contactor 26a on the ID of the intermediate member but on the opposite side from that indicated in FIG. 4 in order for a contactor signal to be generated at radially outward movement of the member 18 rather than radially inward movement of the member 18 as is shown in FIG. 4. It should be appreciated that alterations could be made that maintain the overall concept of the embodiment but move where the contactor 26a is placed such that a particular part of the motion of the sensor 12a is used for contactor 26 closing. Any of these configurations might be selected for a particular embodiment depending upon which motion for contact would be optimal for a particular situation.

In an embodiment, still referring to FIG. 4, there are a plurality of members 18. There would be at least two in this embodiment but could be more than two. The purpose would be to reduce false trigger events. One might appreciate having read the foregoing that a one member 18 sensor 12a might bump into a wall or other restriction of a string, within which the dart is being dropped and send unintended contactor 26a closure signals during movement of the dart 10 resulting in an inaccurate landing feature count. Obviously, this would degrade the utility of the device. One way to help avoid unintended contactor signals of this type being counted in the electrical counter 14 is to use a plurality of members 18. In a particular embodiment, where there are two members 18, as illustrated in FIG. 4, the two members 18 are disposed oppositely in the housing 32. In this configuration, the members 18 are both hydraulically urged radially outwardly in two opposing directions. Each of the members 18 is in operable communication with a contactor 26a and those contactors are wired in series. Because of this construction, both of the member 18 in this embodiment must be depressed at the same time in order for a signal to be generated through the series wired contactors 26a when they simultaneously contact the actuator 38. It will be noted the two first member18/intermediate28/second member 30 combinations are offset in FIG. 4. This is due to the arrangement of the hydraulic diameters of members 18 and 30 for each combination as disclosed above. Note too that embodiments could also lack the different hydraulic diameters but rather use some other configuration to bias the member 18. This could be coil springs, leaf springs, wave springs, elastic materials, high pressure gas chambers, etc.

Figure 5A:
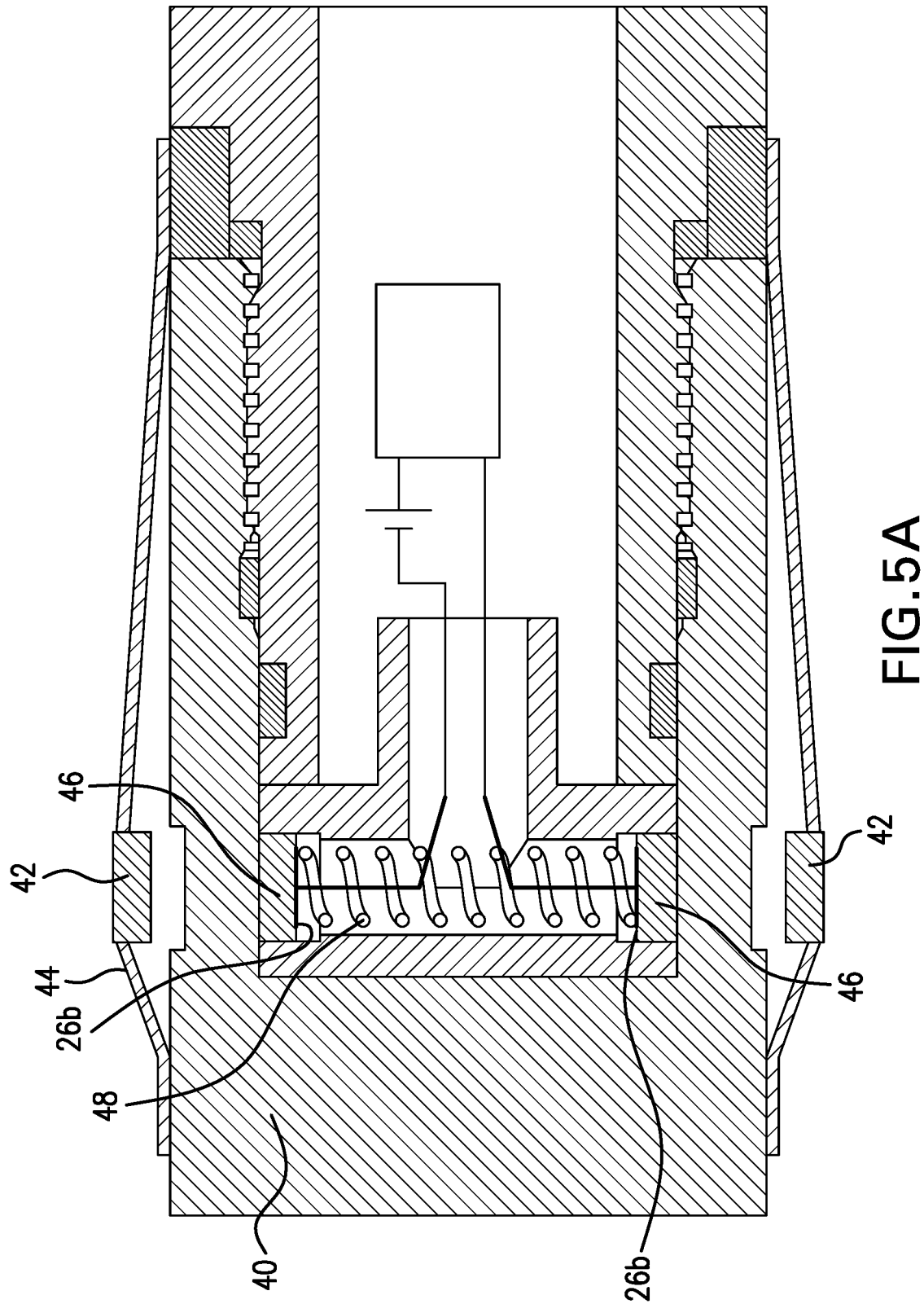
FIG. 5a is a section view of an alternate embodiment of the mechanical sensor (that would replace the mechanical sensor illustrated in FIG. 1) in a non-triggered position.
Figure 5B:
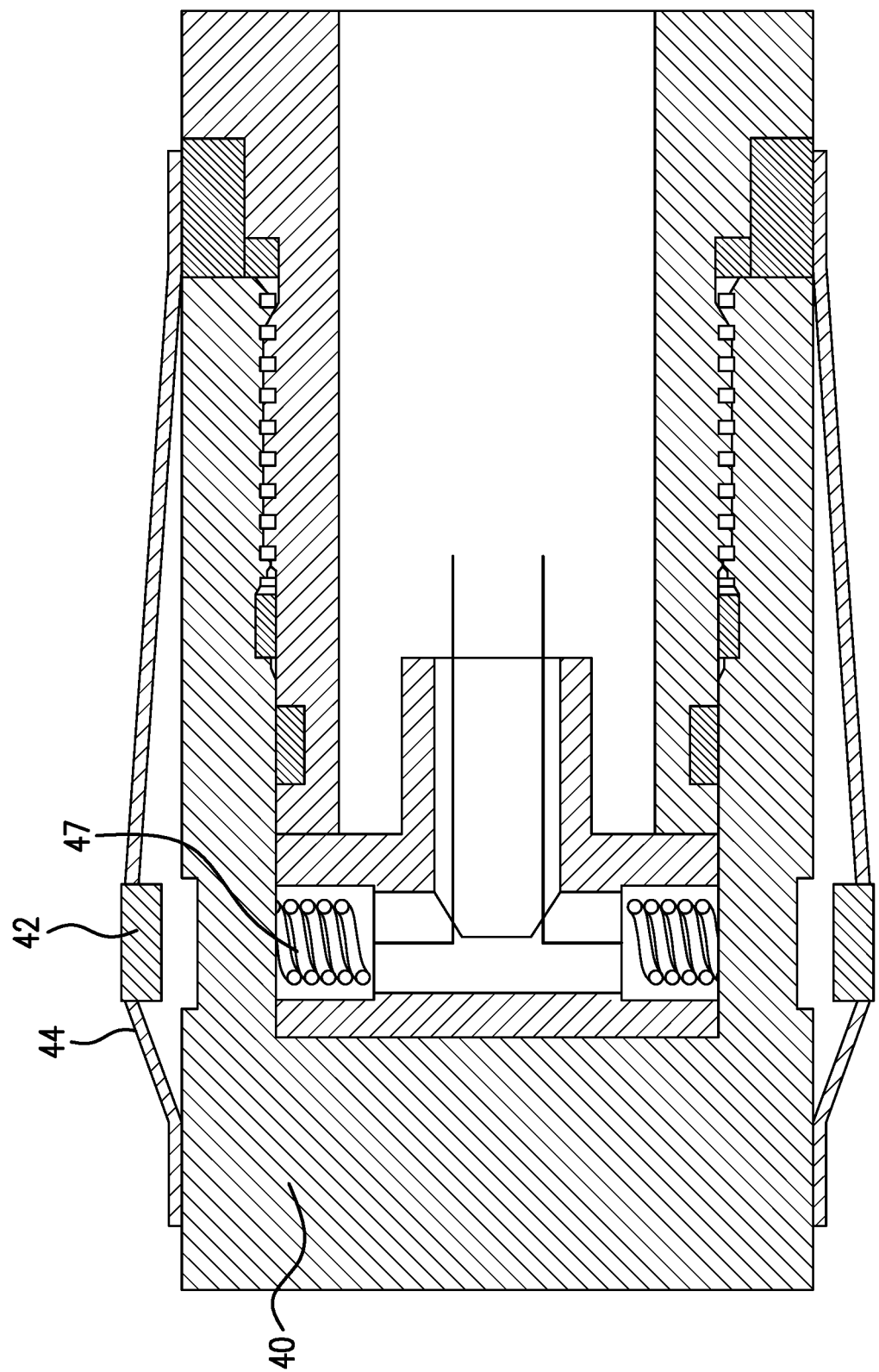
FIG. 5b is a section view of another alternate embodiment of the mechanical sensor (that would replace the mechanical sensor illustrated in FIG. 1) in a non-triggered position.
Figure 6:
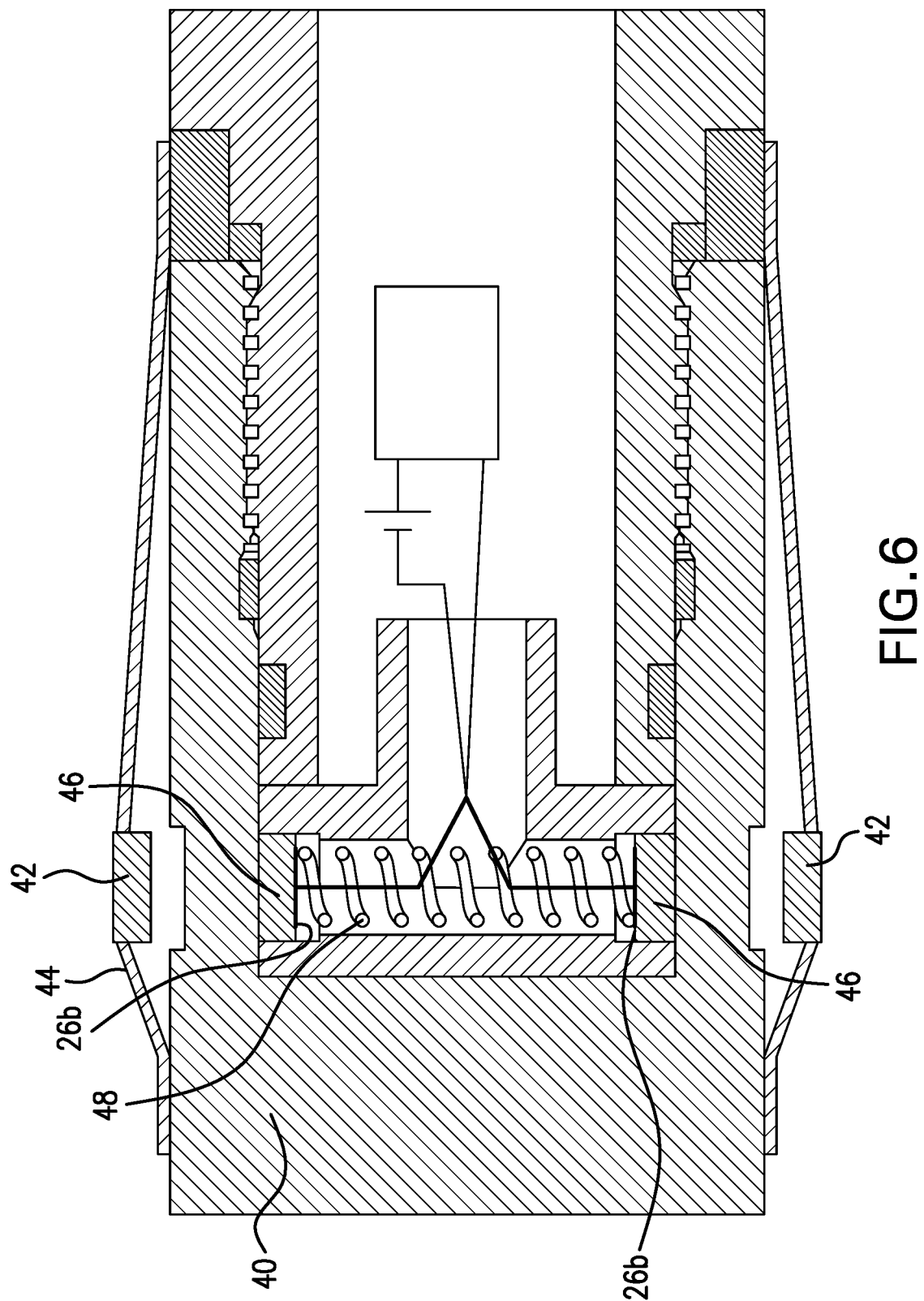
FIG. 6 is the view of FIG. 5 in a triggered position (similar for 5b)

In an alternate embodiment, the mechanical sensor 12, referred to for this embodiment as 12b employs magnets in its construction. The magnets may be of opposed polarity. Referring to FIGS. 5 (a and b) and 6, schematic views show the sensor 12b in a non-triggered position (FIG. 5) where contactors 26b are not closed and in a triggered position (FIG. 6) where contactors 26b are closed or coils have generated voltage. The sensor 12b operates across a pressure housing 40 while not penetrating through the pressure housing 40. In an embodiment, the pressure housing 40 may include a window that is constructed of a nonmagnetic material or the entire pressure housing 40 may be constructed of a non-magnetic material. Sensor 12b includes first magnet 42 disposed upon a bias member 44 (which may be, for example a leaf spring) to hold the first magnet radially outwardly of the pressure housing 40. In an embodiment, the first magnet 42 is arranged such that its polarity will oppose a second magnet 46 located inside of the housing 40. A biaser 48, which may be a spring, is disposed radially inwardly of the second magnet 46. A contactor 26b is disposed between the biaser 48 and the second magnet 46 and is closable based upon the second magnet 46 being pushed against the biaser 48. In order for the sensor 12b to trigger, first magnet 42 must be deflected radially inwardly by physically contacting a landing feature (not shown but like 22 in FIG. 2). Upon first magnet 42 being radially deflected, the magnetic fields of first magnet 42 and second magnet 46 (that are arranged with opposing polarity) will oppose each other thereby causing the second magnet 46 to move radially inwardly inside of the pressure housing as the first magnet 42 moves radially inwardly outside of the housing even though the pressure housing itself is not penetrated. If the pressure housing includes a non-magnetic material either in total or in the form of a window that is placed between the first and second magnets the magnetic fields will pass more easily and hence action may be stronger for a given magnet or a magnet with a weaker field may be substituted to reduce manufacturing costs. This embodiment (and that of 5b addressed below) benefits from the lack of a penetration in the pressure housing since sealing and leak points are avoided. As illustrated, there are a plurality first magnets 42. There may of course be one or more but it is noted that where a plurality of at least two are used, it is possible for this embodiment to be resistant to unintended triggering similarly to the foregoing embodiment, Specifically, if the contactors 26b are wired in series, all of the plurality of first and second magnet pairs (or at least two of them) would have to be deflected radially inwardly at the same time in order for a circuit to be completed whereby the electric counter could increment. In the case of FIG. 5b, the second magnets 46 and contactors 26b are replaced with coils 47. Movement of first magnet 42 inductively causes the coil 47 to generate a voltage and hence provide the same signal that the contactor 26b would have provided to the electric counter 14.

Figure 7:
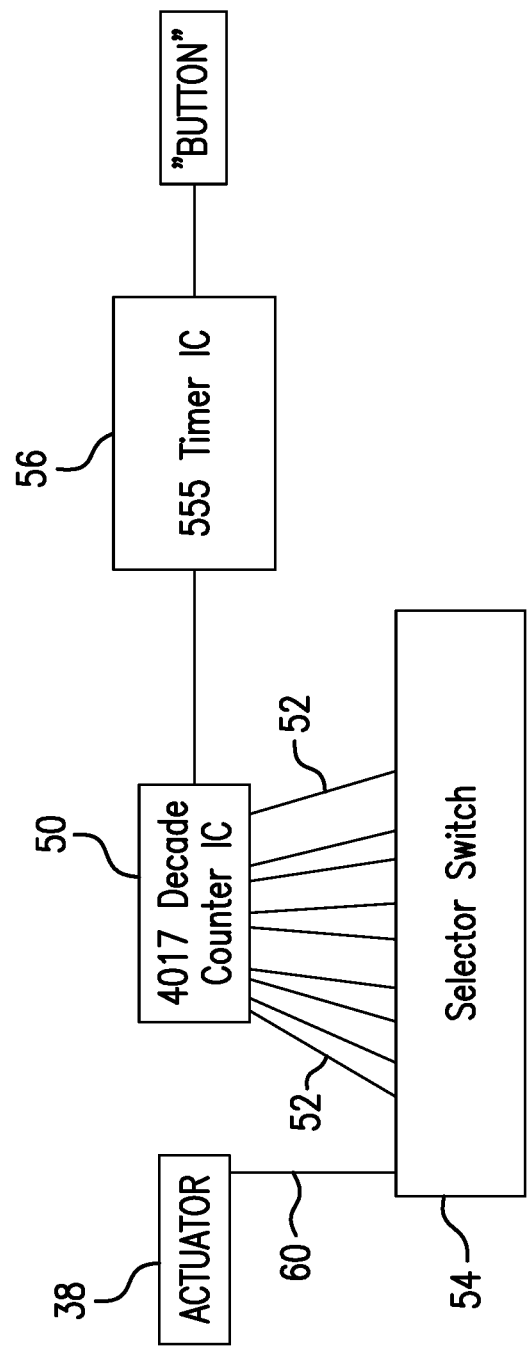
FIG. 7 is a schematic layout of an electronics package of the frac dart disclosed herein.

Regardless of the selected mechanism by which the mechanical sensor 12 operates, the result is that one or more of the contactors 26 are closed when the dart 10 encounters a landing feature 22. Closure of a contactor or a plurality of contactors that are wired in series results in an electrical circuit being competed that provides a signal at the electric counter 14 that is disposed in the dart 10. Signals properly received at the electric counter 14 become a count. At a specific predetermined count, a signal will be sent from the electric counter 14 to the mechanical engagement configuration 16. In order to provide full understanding of the electric counter 14, reference is made to FIG. 7 where one embodiment of the electric counter 14 is presented via a schematic diagram. In this embodiment, a counter 50, which may be in the form of an integrated circuit (IC) is used as a very low energy counting device that will increment one count for each signal suppled thereto and then generate a signal to a different lead 52 every time the counter counts another count. In one specific embodiment, this IC is a 4017 decade counter widely commercially available. The counter IC 50 is connected to a selector 54 that may be configured as a set of physical switches that allow the user to program in a desired landing feature. Specifically, the selector 52 will receive the signal from the counter 50 along one of the leads 52. If that lead 52 is electrically connected (because the switch 54 is so programed), the switch will output a signal to an activator 60 of the actuator 38.

With regard to programming or setting or configuring the electric counter 14, an insertable mechanically or electrically encoded device is contemplated, which is generically referred to herein as a "Key". Such a key may be configured to only select a particular landing feature 22 or may also be configured to complete a power circuit of the counter 14. Keys may be made robustly and are easy to insert through a key opening somewhere on the dart 10. This can be quickly achieved on the rig by untrained personnel and without the need for higher tech equipment as noted previously. Form factors for the key include punch cards (configured to break specific connections or to make specific connections upon insertion), flash drives, mechanical key, RFID or electrical component (SIM card type device)., etc. In embodiments that use the key to complete a power circuit as well as select a target landing feature 22 will tend to lengthen shelf life of the dart 10 since the battery would be better isolated from parasitic losses during storage.

In some embodiments of electric counter 14, an additional component may be added to reduce spurious trigger events becoming counts. That component is a timer 56 that essentially only allows trigger events to occur with a minimum periodicity. Contactor closing events happening more quickly than the minimum periodicity set by the timer would be excluded. Timer 56 is in some embodiments a commercially available device known as a 555 timer. Some of the spurious contactor 26 closures that would be excluded by timer 56 are due to conditions such as the tool bouncing against something (even a landing feature 22) to cause multiple contactor closures in rapid succession when only one closure should be registered.

Referring back to FIGS. 1-3 now, the mechanical engagement configuration 16 is described. One embodiment of the configuration 16 is illustrated in the Figures hereof but it is to be understood that many other actuation concepts may be applied to this dart 10. For example, while the below described configuration is hydraulically energized and uses an electric activator, it is also possible to use a powder charge based energy source and ignitor instead of the hydraulic source and electric activator or could employ an elastic energy source such as a spring compressed axially against the actuator 38. Moreover, a solenoid, motor driven shaft, motor driven hydraulic pump, or other similar configurations could be used. An activator is considered something that releases or participates in the release of energy held in an actuator (burn wire, solder, etc.) whereas an actuator is something that creates that energy (solenoid, etc.). The construction and paradigm used for configuration 16 must respond to an electric signal (generated by the electric counter 14 and related to a specific landing feature location) and provide a mechanical engagement sufficient to allow fracturing pressure to be applied to the dart 10 in that position. As illustrated the configuration 16 employs dogs 62 that reside in housing 32. During running the dogs 62 are maintained below a drift diameter of the string the dart 10 is run within. When desired (pursuant to the counting and related functions of the dart 10), the dogs 62 may be driven radially outwardly by the actuator 38. It will be appreciated from FIG. 2 that the dogs 62 include a chamfer 64 thereon that cooperates with wedge 66 of actuator 38. The wedge 66 moves the dogs 62 radially outwardly upon axial movement of the actuator 38 from the position shown in FIG. 2 to that shown in FIG. 3. The dogs 62 will then reside upon support surface 68 of actuator 38. For this embodiment, the axial movement of actuator 38 occurs based upon hydrostatic pressure on differing piston areas of the actuator 38. These are at surfaces 70 and 72, with 72 being of smaller diameter and hence having the smaller hydraulic area. Seals 74 and 76 facilitate the maintenance of the differential pressure. Actuator 38 is maintained in the pre-deployed position in spite of the hydraulic differential pressure acting thereupon by the activator 60. Activator 60 is a device that responds to a signal from the electric counter 14 and releases the actuator 38 for movement. The activator 60 may be a Kevlar wire, a meltable connection such as solder or bismuth, etc. The activator may also be any fusible/burnable material.

In each of the described embodiments, the mechanical sensor 12, the electrical counter 14 and the mechanical engagement configuration 16 are all a part of a fracture dart that is configured to move through fracture landing features and count them until the dart reaches a preprogramed feature and then engage there. It is important to point out that one could reverse all of the parts discussed. Specifically, the mechanical sensor 12, the electrical counter 14 and the mechanical engagement configuration 16 could be a part of a sleeve and landing feature instead of part of the dart. In such a case, the mechanical sensor first members would extend radially inwardly from the sleeve instead of radially outwardly from the dart. If the first members were made to be like dogs or collet type features, then the mechanical engagement configuration portion of this alternate concept could be combined with the mechanical sensor because the same members used for sensing would also form a landing feature to catch a ball or dart and hold it there. The sensing members would simply need to be lockable in the extended position. When a dart passes such a landing feature of such alternate device, a count within the landing feature would be made. The feature would ignore darts or balls that pass through until it gets to a preselected count and then would signal the engagement feature to extend radially inwardly or signal the sensor members to lock to prevent radial outward movement to catch the next dart or ball. The result is similar to the foregoing embodiments in that a mechanical sensing and an electrical counting is employed but it requires that the landing features all have power wither by a hard line or by batteries or other source. Batteries and other components must also be put in the well during construction thereof and then stay viable for a long time.

Figure 9:
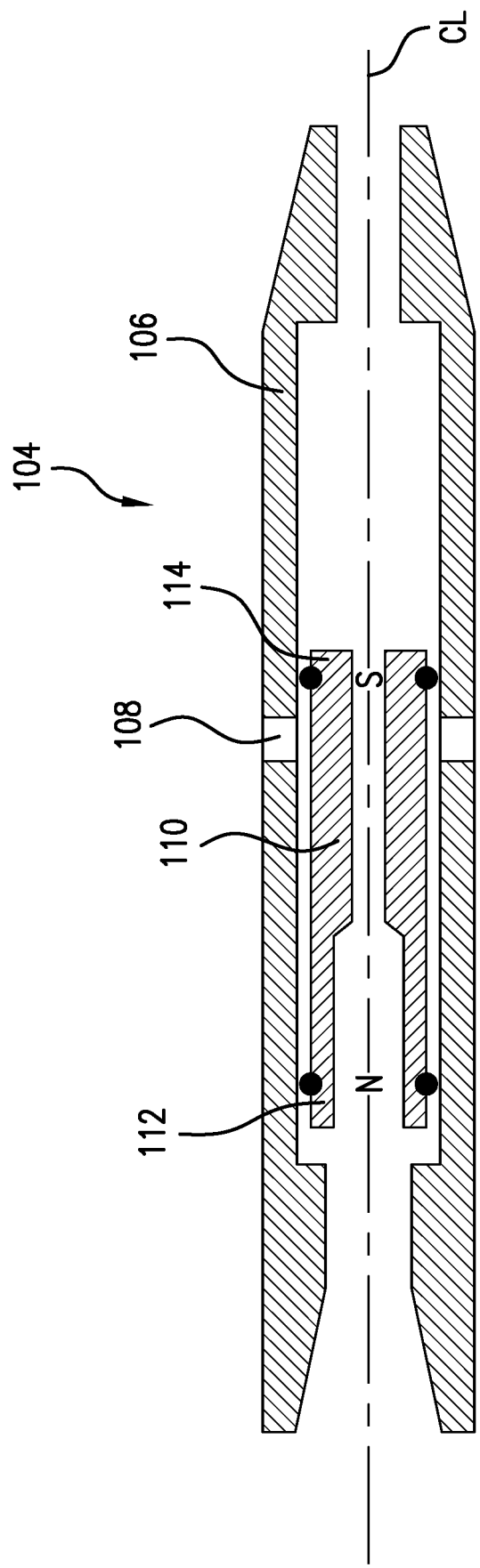
FIG. 9 is a view of a frac sleeve as disclosed herein that is operable with the dart of FIG. 7.

Referring to FIG. 9, another embodiment of dart identified by numeral 80 has a similar electric counter 82 and similar mechanical engagement configuration 84 but further comprises a coil 86 (that may be copper in embodiments) disposed therewith. The coil 86 when moving rapidly through a magnetic field will work as an inductor and generate voltage for each field through which it passes. Because the dart 80 is a fracturing device, it is pumped into the wellbore at speeds of about 15 feet per second which will produce a voltage in the coil as it passes fixed position fields.

Figure 8:
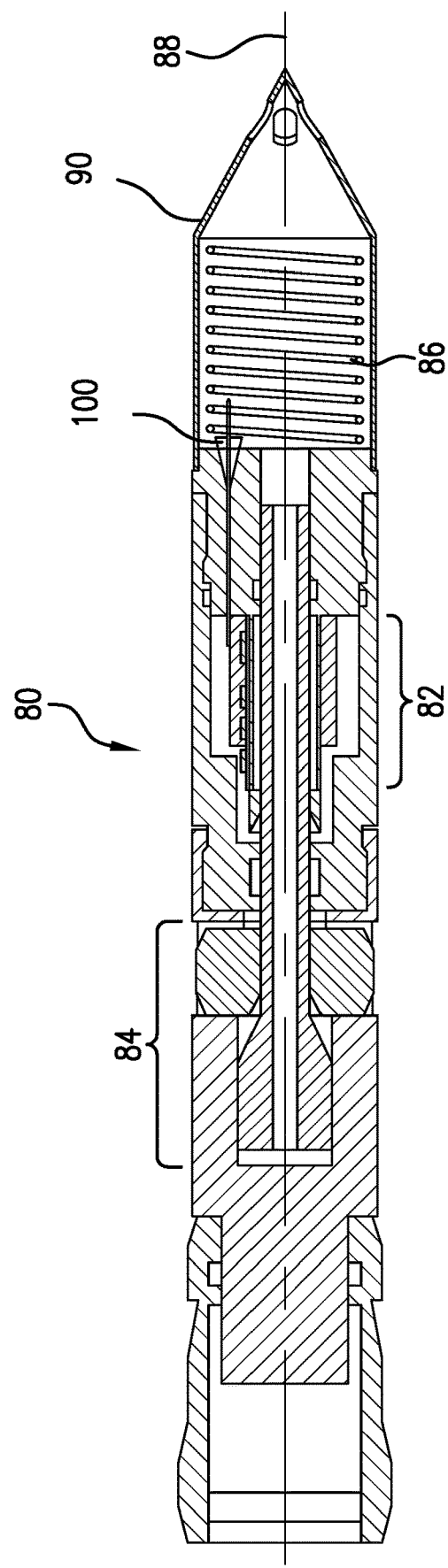
FIG. 8 is a section view of an alternate embodiment of a dart as disclosed herein.

The coil may be in different orientations but the orientation depicted in FIG. 8 will produce the greatest voltage when the dart passes through a magnetic field whose field lines are generally parallel to the axis 88 of the coil 86 (in accordance with Faraday's law), which will be the case in an embodiment hereof discussed hereunder. Also, the number of turns in the coil and wire thickness may be selected to ensure generation of an appropriate magnitude of voltage will be generated from passing through the fields available. The coil 86 may be disposed in a protective housing 90 or not and that housing may be fluid proof or not. In either case where a housing 90 is used, that housing will desirably comprise a non-magnetic material in order to be essentially transparent to the magnetic field through which it will pass during use. In the event the housing 90 is employed and is not fluid proof, as is depicted in FIG. 8, wellbore fluid will reach the coil 86 and hence a seal 100 will be needed to prevent fluid entering the area of the electric counter 82. In such embodiment, it is important to insulate the coil because wellbore fluids tend to be conductive and as such will deleteriously affect operation of the coil. The insulation may be a coating on the conductor of the coil and is familiar to one of ordinary skill in the art. Using the open fluid configuration, where a housing 90 is employed means that the housing 90 need not be a pressure housing so cost is saved. The housing 90 can, of course, be configured as a pressure housing and then the seal 100 should not be needed. It is also contemplated that the coil 86 could be placed inside the same portion of the dart 80 that the electric counter is in. In this case, the coil can be physically protected in that same portion of the dart 80 but that portion of the dart would then benefit from comprising a non-magnetic material for the same reason the housing 90 would be ideally comprise a non-magnetic material.

Figure 10:
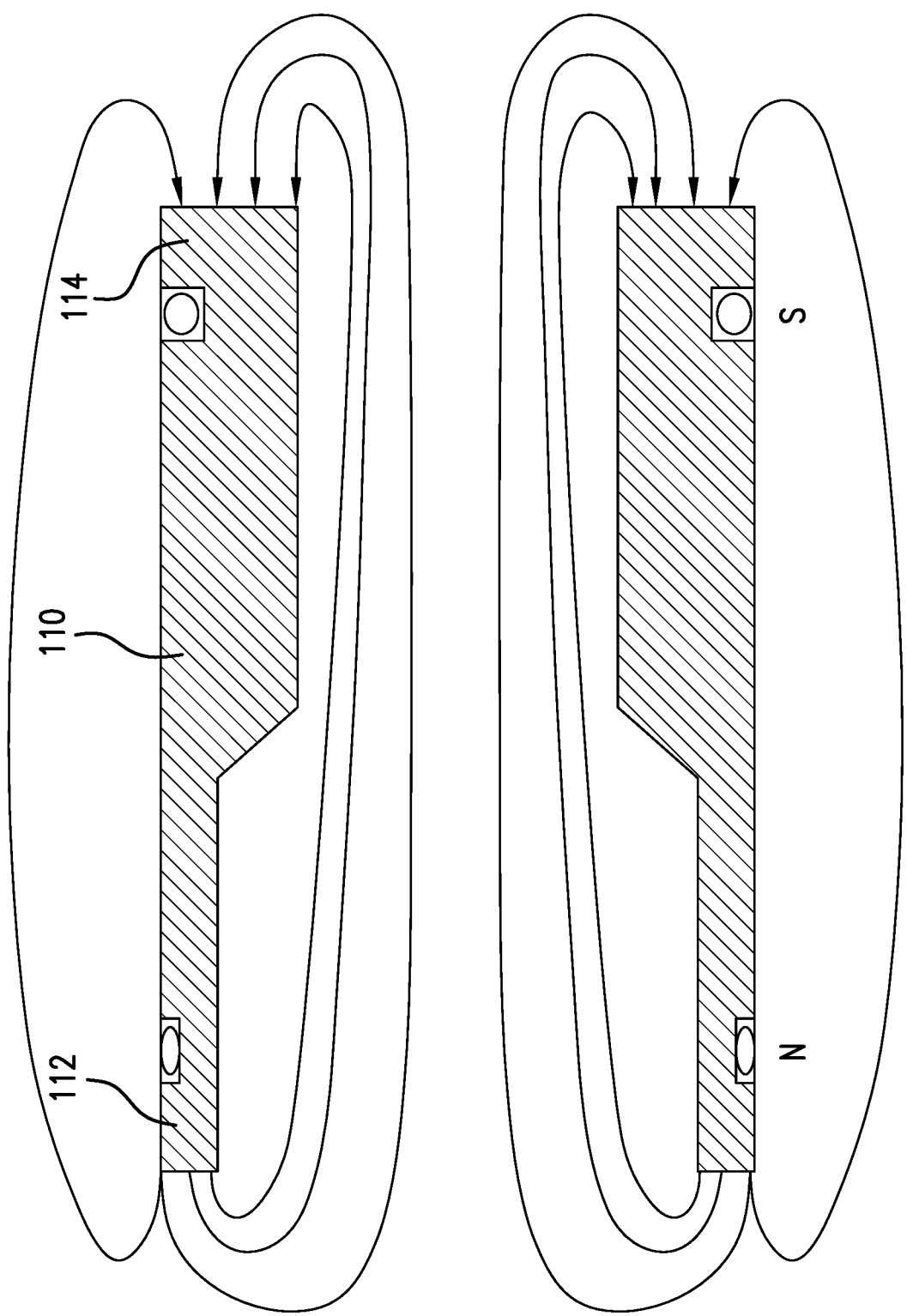
FIG. 10 is a view of an insert of the frac sleeve with magnetic field lines shown.

Referring to FIGS. 9 and 10, a frac sleeve 104 is illustrated. The sleeve 104 includes a housing 106 defining a radial port 108 therethrough. A closure member 110 is disposed within the housing 106. Those of skill in the art will recognize the general layout of the housing 106 and closure member 110 as common. In connection with this disclosure however, the closure member 110, the housing 106 or both are magnetized directly, or discrete magnets are placed on either or both of these parts. Resultantly, a magnetic field is to be created about at least some of the parts of the frac sleeve 104. In the illustration of FIGS. 9 and 10, the magnetized element is the closure member 110. It should be understood that the field lines would be similar but longer if it were the housing 106 that was magnetized. The closure member 110 has a north pole at a first end 112 and a south pole at a second end 114. The field lines generated by magnetization in this configuration are toroidal and illustrated in FIG. 10. The field lines run largely axially through the closure member 110. The axial lines of flux are what makes the orientation of the coil 86 as illustrated in FIG. 8 desirable. Since the flux lines are generally parallel to the axis of the coil 86, a best case voltage should be generated.

Figure 11:
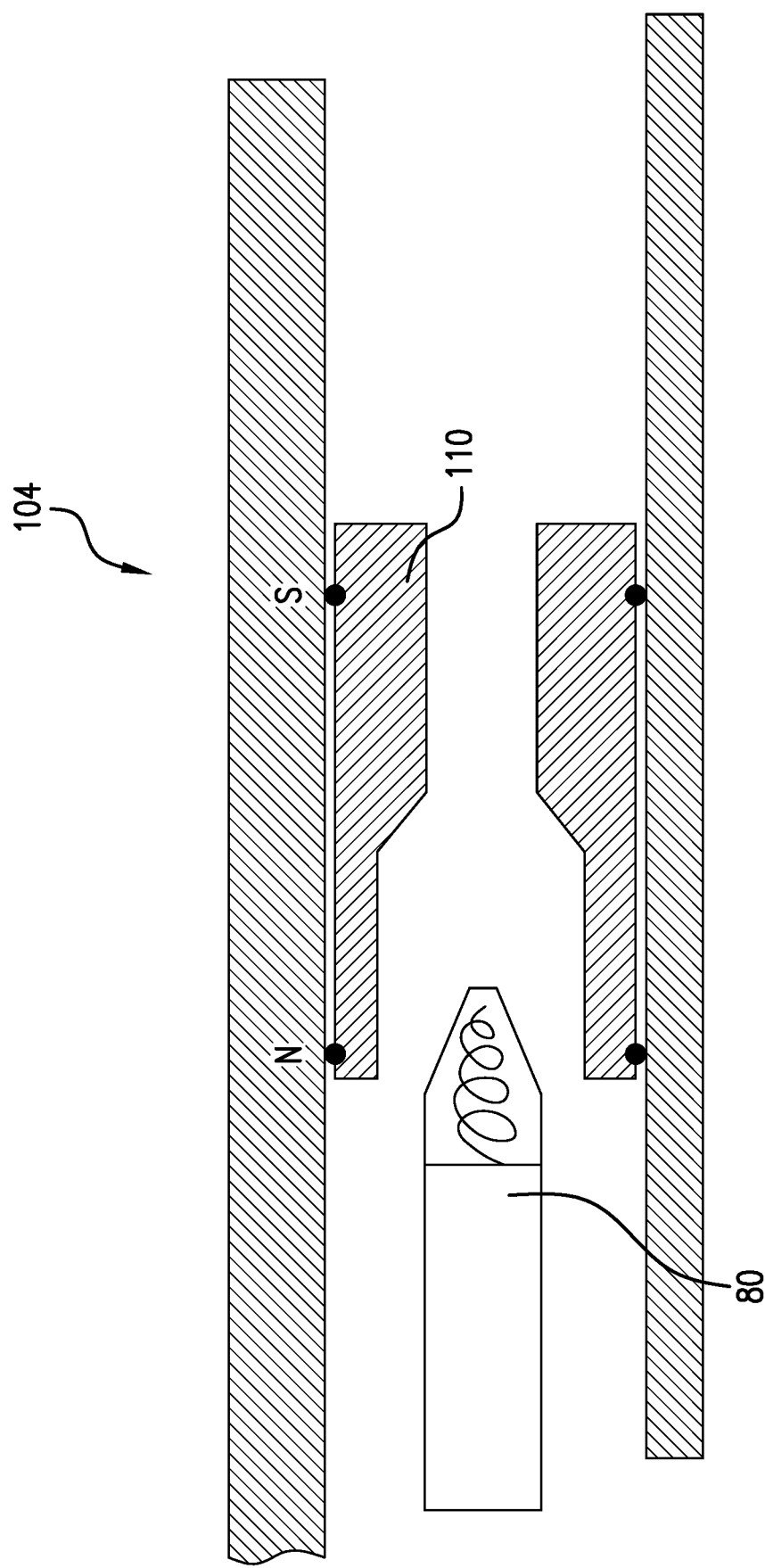
FIG. 11 is a view illustrating the dart of FIG. 7 traveling through the frac sleeve of FIG. 9.

Referring to FIG. 11, the dart 80 illustrated in FIG. 8 is rendered functional by passing through the magnetic field of the frac sleeve 104. As the dart 80, and particularly its coil 86 passes through the field shown in FIG. 10, a current will be inductively generated in the coil 86. That current is passed to the electric counter 82 to generate a count as did previous embodiments. In this way, an unlimited number of Frac sleeves 104 may be staged and this dart 80 can select whichever one was programmed or configured into the dart 80. Programming or configuration will be as in the previous embodiments. The dart 80 benefits from needing no battery at all or only a smaller one than in the previous embodiment to trigger the activator for the mechanical engagement configuration 84.

In embodiments that use the coil 86, some may benefit from the addition of an amplifier to ensure the signal received at the electric counter is of sufficient magnitude to trigger a count there. Also, in some embodiments, a de-amplifier might be employed to condition the signal for the IC.

It is to be noted that any of the elements of the foregoing embodiments may be mixed and matched to address specific situations without departing from the scope of the invention. Further, many if not all of the components of the dart embodiments may be made of degradable material such as controlled electrolytic material available from Baker Hughes Houston Texas.

Figure 12:
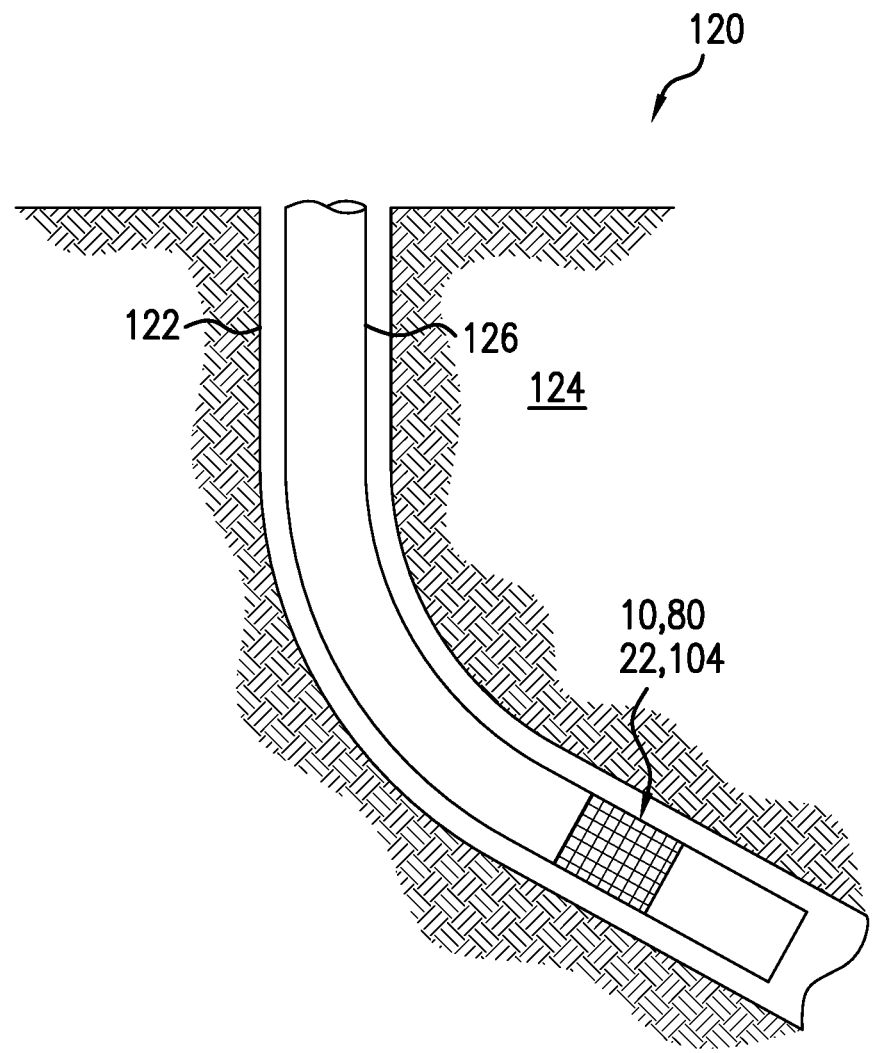
FIG. 12 is a schematic representation of a wellbore system employing the frac dart as disclosed herein.

Referring to FIG. 12, a wellbore system 120 is also disclosed wherein a borehole 122 is disposed in a subsurface formation 124. A string 126 is disposed in the borehole 122 and one or more of the dart 10 or 80 or the alternate landing features described immediately above are disposed in the string. The wellbore 120 may have a large number of landing features 22 or 104 therein providing for a large number of stages that can be run in one shot. The number of possible stages is only limited by the number of individual addresses creatable in the electric counter 14 or 82. About 200 stages may be achieved on a simple 8-bit structure, for example. Moreover, through the use of the dart 10 or 80 described herein, all of the landing features 22 or 104 may be the same as each other. This reduces inventory on hand since specific landing features for specific locations are not needed. This also brings the additional benefit that the landing features need not be installed in any particular order as was required in prior art profile type systems.

Set forth below are some embodiments of the foregoing disclosure:

Embodiment 1: A frac dart including a pressure housing, a mechanically actuated magnetic sensor including a first magnet outside of the pressure housing, a signal generator inside the pressure housing and in operable communication with the first magnet, and an electrical counter disposed in the frac dart responsive in increments to the signal generator.

Embodiment 2: The dart as in any prior embodiment, wherein the signal generator is a second magnet and a contactor.

Embodiment 3: The dart as in any prior embodiment, wherein the signal generator is a coil.

Embodiment 4: The dart as in any prior embodiment, wherein the pressure housing includes a nonmagnetic material.

Embodiment 5: The dart as in any prior embodiment, wherein the nonmagnetic material is the entire pressure housing.

Embodiment 6: The dart as in any prior embodiment, wherein the nonmagnetic material is in the form of a window placed within the pressure housing between the first magnet and second magnet.

Embodiment 7: The dart as in any prior embodiment, wherein the first magnet and second magnet are arranged with opposing polarities.

Embodiment 8: The dart as in any prior embodiment, wherein the first magnet is mounted to a bias member.

Embodiment 9: The dart as in any prior embodiment, wherein the bias member is a leaf spring.

Embodiment 10: The dart as in any prior embodiment, wherein the second magnet is arranged to operate a contactor to close a count circuit.

Embodiment 11: The dart as in any prior embodiment, wherein the mechanically actuated magnetic sensor includes a biaser in operable communication with the second magnet.

Embodiment 12: The dart as in any prior embodiment, wherein the contactor is between the second magnet and a biaser.

Embodiment 13: The dart as in any prior embodiment, wherein the mechanically actuated magnetic sensor includes a plurality of first magnets, a plurality of second magnets, and a plurality of contactors closable by movement among first and second magnets of a plurality of pairs of first and second magnets, the contactors being series wired.

Embodiment 14: The dart as in any prior embodiment, wherein at least a plurality of the plurality of pairs of first and second magnets are in opposing positions relative to the pressure housing.

Embodiment 15: The dart as in any prior embodiment, wherein the opposing positions are diametrically opposed.

Embodiment 16: A method for fracturing a wellbore including running a dart as in any prior embodiment into a wellbore, mechanically displacing the first magnet radially inwardly, and causing the signal generator to generate a signal.

Embodiment 17: The method as in any prior embodiment wherein the causing is by closing a contactor with a second magnet.

Embodiment 18: The method as in any prior embodiment wherein the causing is by inducing a current in a coil pursuant to the displacing of the first magnet.

Embodiment 19: The method as in any prior embodiment further including configuring the dart.

Embodiment 20: The method as in any prior embodiment wherein the configuring is inserting a key into the dart.

Embodiment 21: The method as in any prior embodiment further including activating an actuator to mechanically engage a preselected landing feature.

Embodiment 22: The method as in any prior embodiment further comprising applying pressure to the dart while engaged with the preselected landing feature and causing fracture of the wellbore with the pressure.

Embodiment 23: A wellbore system including a borehole in a subsurface formation, a string disposed in the borehole, and a dart as in any prior embodiment disposed with the string.

The use of the terms "a" and "an" and "the" and similar referents in the context of describing the invention (especially in the context of the following claims) are to be construed to cover both the singular and the plural, unless otherwise indicated herein or clearly contradicted by context. Further, it should be noted that the terms "first," "second," and the like herein do not denote any order, quantity, or importance, but rather are used to distinguish one element from another. The terms "about", "substantially" and "generally" are intended to include the degree of error associated with measurement of the particular quantity based upon the equipment available at the time of filing the application. For example, "about" and/or "substantially" and/or "generally" can include a range of ±8% or 5%, or 2% of a given value.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited.

What is claimed is:

1. A frac dart comprising:
    a pressure housing;
        a mechanically actuated magnetic sensor including a first magnet outside of the pressure housing;
        a signal generator inside the pressure housing and in operable communication with the first magnet, wherein the signal generator is a second magnet and a contactor; and
        an electrical counter disposed in the frac dart responsive in increments to the signal generator.

2. The dart as claimed in claim 1 wherein the pressure housing includes a nonmagnetic material.

3. The dart as claimed in claim 1 wherein the pressure housing is entirely nonmagnetic.

4. The dart as claimed in claim 1 wherein the first magnet and second magnet are arranged with opposing polarities.

5. The dart as claimed in claim 1 wherein the first magnet is mounted to a bias member.

6. The dart as claimed in claim 5 wherein the bias member is a leaf spring.

7. The dart as claimed in claim 1 wherein the second magnet is arranged to operate the contactor to close a count circuit.

8. The dart as claimed in claim 1 wherein the mechanically actuated magnetic sensor includes a biaser in operable communication with the second magnet.

9. The dart as claimed in claim 1 wherein the contactor is between the second magnet and a biaser.

10. The dart as claimed in claim 9 wherein the mechanically actuated magnetic sensor includes a plurality of first magnets, a plurality of second magnets, and a plurality of contactors closable by movement among first and second magnets of a plurality of pairs of first and second magnets, the contactors being series wired.

11. The dart as claimed in claim 10 wherein at least a plurality of the plurality of pairs of first and second magnets are in opposing positions relative to the pressure housing.

12. The dart as claimed in claim 11 wherein the opposing positions are diametrically opposed.

13. A method for fracturing a wellbore comprising:
    running a dart as claimed in claim 1 into a wellbore;
    mechanically displacing the first magnet radially inwardly; and
    causing the signal generator to generate a signal.

14. The method as claimed in claim 13 wherein the causing is by closing the contactor with the second magnet.

15. The method as claimed in claim 13 further including configuring the dart.

16. The method as claimed in claim 15 wherein the configuring is inserting a key into the dart.

17. The method as claimed in claim 16 further including activating an actuator to mechanically engage a preselected landing feature.

18. The method as claimed in claim 17 further comprising applying pressure to the dart while engaged with the preselected landing feature and causing fracture of the wellbore with the pressure.

19. A wellbore system comprising:
a borehole in a subsurface formation;
a string disposed in the borehole; and
a dart as claimed in claim 1 disposed with the string.

20. A frac dart comprising:
a pressure housing;
a mechanically actuated magnetic sensor including a first magnet outside of the pressure housing;
a signal generator inside the pressure housing and in operable communication with the first magnet, wherein the signal generator is a coil; and
an electrical counter disposed in the frac dart responsive in increments to the signal generator.

21. A method for fracturing a wellbore comprising:
running a dart as claimed in claim 3 into a wellbore;
mechanically displacing the first magnet radially inwardly; and
causing the signal generator to generate a signal wherein the causing is by inducing a current in the coil pursuant to the displacing of the first magnet.

22. A frac dart comprising:
a pressure housing;
a mechanically actuated magnetic sensor including a first magnet outside of the pressure housing;
a signal generator inside the pressure housing and in operable communication with the first magnet;
an electrical counter disposed in the frac dart responsive in increments to the signal generator; and wherein the pressure housing includes a nonmagnetic material in the form of a window.

23. The dart as claimed in claim 22 wherein the window is placed between the first magnet and the signal generator.

* * * * *